(12) United States Patent
Bishop et al.

(10) Patent No.: US 8,902,943 B2
(45) Date of Patent: Dec. 2, 2014

(54) SYSTEM FOR COOLING ELECTRONIC COMPONENTS

(71) Applicant: Christie Digital Systems Canada Inc., Kitchener (CA)

(72) Inventors: Michael Bishop, Kitchener (CA); Mirko Stevanovic, Toronto (CA)

(73) Assignee: Christie Digital System USA, Inc., Cypress, CA (US)

( * ) Notice: Subject to any disclaimer, the term of this patent is extended or adjusted under 35 U.S.C. 154(b) by 0 days.

(21) Appl. No.: 13/798,266

(22) Filed: Mar. 13, 2013

(65) Prior Publication Data

US 2014/0269797 A1    Sep. 18, 2014

(51) Int. Cl.
*H01S 3/04*      (2006.01)
*H05K 7/20*     (2006.01)

(52) U.S. Cl.
CPC .......... *H05K 7/20354* (2013.01); *H01S 3/0404* (2013.01); *H01S 3/0407* (2013.01); *H05K 7/202* (2013.01)
USPC .................................. 372/35; 372/34; 372/36

(58) Field of Classification Search
CPC ....... H01S 3/04; H01S 5/024; H01S 5/02446; H01S 5/02423; H01S 5/0243; H01S 5/02469; H01S 5/02476

USPC ...................................................... 372/34–36
See application file for complete search history.

(56) References Cited

U.S. PATENT DOCUMENTS 6,205,803 B1 *   3/2001   Scaringe ...................... 62/259.2
2012/0154598 A1 *   6/2012   Houde-Walter et al. ...... 348/164

* cited by examiner

*Primary Examiner* — Xinning Niu
*Assistant Examiner* — Vu A Vu
(74) *Attorney, Agent, or Firm* — Perry + Currier, Inc

(57) ABSTRACT

A system for cooling electronic components is provided, the system comprising: a first electronic component having a first operating temperature; a second electronic component having a second operating temperature greater than the first operating temperature; a vapor compression loop configured to cool the first electronic component to the first operating temperature; a pumped cooling loop configured to cool the second electronic component to the second operating temperature; and a heat exchanger between the vapor compression loop and the pumped cooling loop, the heat exchanger configured to transfer heat from the pumped cooling loop to the vapor compression loop before the second electronic component is cooled and after the first electronic component is cooled.

17 Claims, 4 Drawing Sheets

SYSTEM FOR COOLING ELECTRONIC COMPONENTS

FIELD

The specification relates generally to cooling systems and specifically to a system for cooling electronic components.

BACKGROUND

Electronic components of different operating temperatures can often be mounted together on the same board, however as they can have different operating temperatures, two separate cooling loops with different incoming fluid temperatures are used to cool each electronic component to their respective operating temperature, which is expensive and wasteful of resources. Alternatively one cooling loop can be used to cool all the electronic components to the same incoming fluid temperature, but then at least one of the electronic components will be operating at a non-ideal temperature.

SUMMARY

In this specification, elements may be described as "configured to" perform one or more functions or "configured for" such functions. In general, an element that is configured to perform or configured for performing a function is configured to perform the function, or is enabled to perform the function, or is suitable for performing the function, or is adapted to perform the function or is operable to perform the function, or is otherwise capable of performing the function.

The present specification provides a system comprising: a first electronic component having a first operating temperature; a second electronic component having a second operating temperature greater than the first operating temperature; a vapour compression loop configured to cool the first electronic component to the first operating temperature; a pumped cooling loop configured to cool the second electronic component to the second operating temperature; and a heat exchanger between the vapour compression loop and the pumped cooling loop, the heat exchanger configured to transfer heat from the pumped cooling loop to the vapour compression loop before the second electronic component is cooled and after the first electronic component is cooled.

The heat exchanger can be located after the first electronic component on the vapour compression loop and before the second electronic component on the pumped cooling loop.

The system can further comprise a cold plate, wherein each of the first electronic component and the second electronic component are mounted to the cold plate. Each of the vapour compression loop and the pumped cooling loop can comprise a respective portion of the cold plate adjacent to where the first electronic component and the second electronic component are respectively mounted. The cold plate can comprise the heat exchanger.

The system of claim 1, wherein the heat exchanger can be further configured as a superheater to raise vapour quality of refrigerant in the vapour compression loop before the refrigerant enters a compressor.

The vapour compression loop can comprise a compressor located after the heat exchanger.

The vapour compression loop and the pumped cooling loop can share a condenser.

The vapour compression loop can comprise a refrigerant and, in order, a condenser, an expansion apparatus, a first interface with the first electronic component, a second interface with the heat exchanger, a compressor, the refrigerant returning to the condenser from the compressor. The first interface and the second interface can be combined.

The pumped cooling loop can comprise a cooling fluid, a pump, a condenser, a first interface with the heat exchanger, a second interface with the second electronic component and a pump, the first interface with the heat exchanger located between the condenser and the second interface with the second electronic component. The first interface and the second interface can be combined.

Each of the first electronic component and the second electronic component can comprise a respective laser.

The first electronic component can comprise a red laser and the second electronic component can comprise one or more of a green laser and a blue laser.

The first operating temperature can comprise a sub-ambient temperature and the second operating temperature can comprise a near ambient temperature.

The first operating temperature can be about 25° Celsius and the second operating temperature is about 40° Celsius.

The pumped cooling loop can comprise one or more of a pumped fluid cooling loop, a pumped liquid cooling loop and a pumped refrigerant loop.

BRIEF DESCRIPTIONS OF THE DRAWINGS

For a better understanding of the various implementations described herein and to show more clearly how they may be carried into effect, reference will now be made, by way of example only, to the accompanying drawings in which.

DETAILED DESCRIPTION

Figure 1:
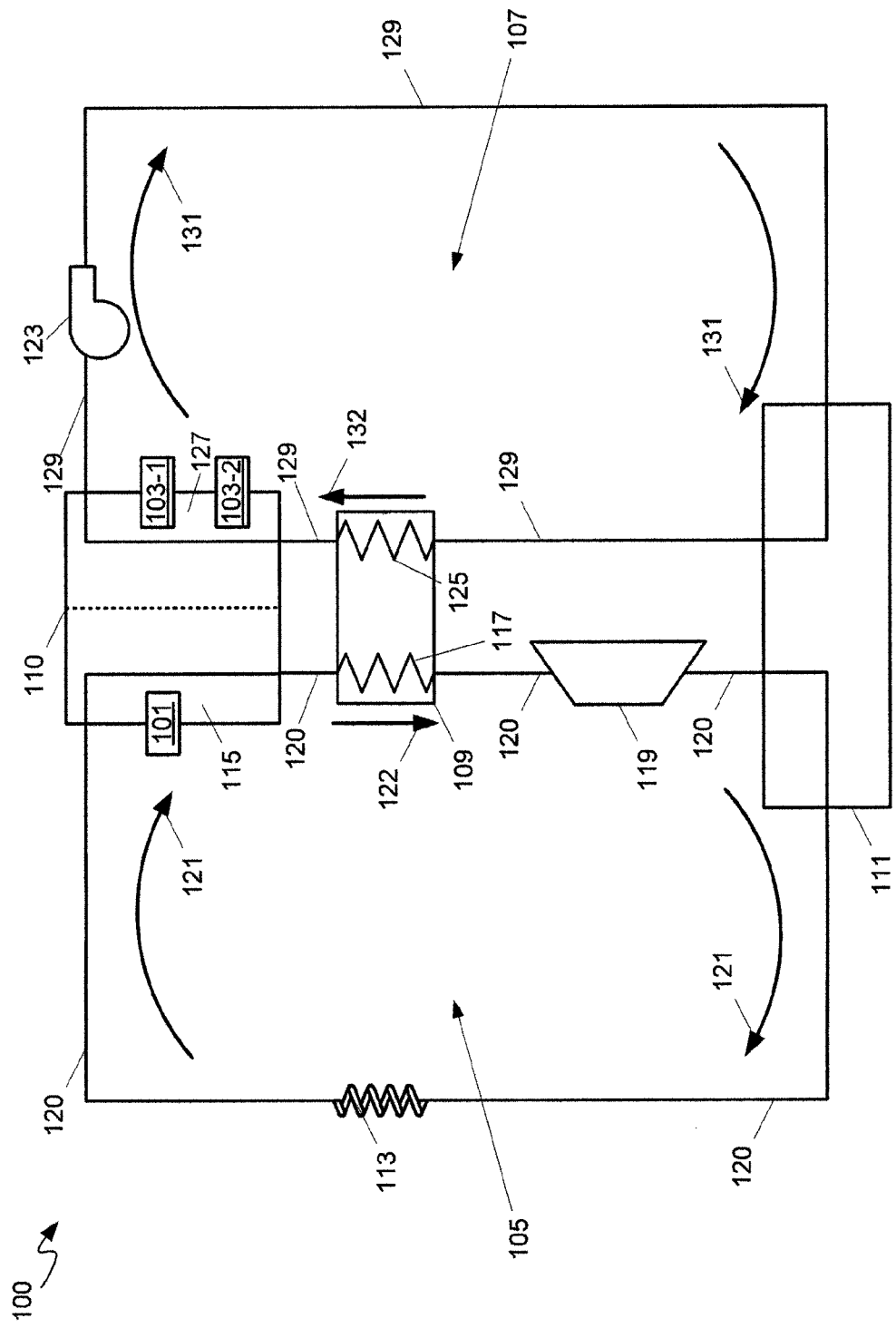
FIG. 1 depicts a schematic diagram of a system for cooling electronic components, according to non-limiting implementations.

FIG. 1 depicts a system 100 comprising: a first electronic component 101 having a first operating temperature; at least a second electronic component 103-1, 103-2 having a second operating temperature greater than the first operating temperature; a vapour compression loop 105 configured to cool first electronic component 101 to the first operating temperature; a pumped cooling loop 107 configured to cool the second electronic component 103-1, 103-2 to the second operating temperature; and a heat exchanger 109 between vapour compression loop 105 and pumped cooling loop 107, heat exchanger 109 configured to transfer heat from pumped cooling loop 107 to vapour compression loop 105 before second electronic component 103-1, 103-1 is cooled and after first electronic component 101 is cooled. Second electronic components 103-1, 103-2 will be interchangeably referred to hereafter, collectively, as second electronic components 103, and generically as a second electronic component 103. Further, while FIG. 1 depicts two second electronic components 103, system 100 can comprise as few as one second electronic component 103, and indeed any number of second electronic components 103 that can be cooled within system 100. Similarly, while FIG. 1 depicts one first electronic component 101, system 100 can comprise any number of first electronic components 101 that can be cooled within system 100.

It is further appreciated that system 100 further comprises a cold plate 110, and each of first electronic component 101 and second electronic component 103 are mounted to cold plate 110. Further, each of vapour compression loop 105 and pumped cooling loop 107 can comprise a respective portion of cold plate 110 adjacent to where first electronic component 101 and second electronic component 103 are respectively mounted, as described further below.

Vapour compression loop 105 comprises, in order, a condenser 111, an expansion apparatus 113, a first interface 115 with first electronic component 101, a second interface 117 with heat exchanger 109, and a compressor 119. It is further appreciated that vapour compression loop 105 further comprises a refrigerant circulating therein, the refrigerant circulating from condenser 111 to expansion apparatus 113, to first interface 115, to heat exchanger 109 and second interface 117, to compressor 119 and back to condenser 111. Refrigerant can include, but is not limited to, R134a.

It is hence further appreciated that vapour compression loop 105 comprises tubing 120, piping and the like for circulating the refrigerant between condenser 111, expansion apparatus 113, first interface 115, second interface 117, and compressor 119. Further, a direction of flow of refrigerant through vapour compression loop 105 and heat exchanger 109 is represented by respective arrows 121, 122.

Indeed, condenser 111, expansion apparatus 113, first interface 115, and compressor 119, along with tubing 120 there between, generally form a refrigeration loop for cooling first electronic component 101. In other words, heat is transferred from first electronic component 101 to first interface 115, thereby cooling first electronic component 101 and causing a change in phase of the refrigerant at first interface 115 in a refrigeration cycle.

It is yet further appreciated that first interface 115 can comprise a portion of cold plate 110 where first electronic component 101 is mounted.

In contrast to vapour compression loop 105, pumped cooling loop 107 comprises a pump 123, condenser 111, a first interface 125 with heat exchanger 109, a second interface 127 with second electronic component 103. Further, first interface 125 with heat exchanger 109 located between condenser 111 and second interface 127 with second electronic component 103. It is further appreciated that pumped cooling loop 107 further comprises a cooling fluid circulating therein; specifically, pump 123 pumps the cooling fluid to condenser 111, to first interface 125, to second interface 127, and back to pump 123. The cooling fluid can include, but is not limited to, a liquid, water, a refrigerant and the like. In other words, pumped cooling loop 107 can comprise one or more of a pumped fluid cooling loop, a pumped liquid cooling loop and a pumped refrigerant loop.

It is hence further appreciated that pumped cooling loop 107 comprises tubing 129, piping and the like for circulating the cooling fluid between pump 123, condenser 111, first interface 125, second interface 127. Further, a direction of flow of the fluid through pumped cooling loop 107 and heat exchanger 109 is represented by respective arrows 131, 132.

While pump 123 is depicted as located between cold plate 110/second interface 127 and condenser 111, it is appreciated that other locations of pump 123 are within the scope of present implementations, including, but not limited to, between heat exchanger 109 and cold plate 110 and/or between heat exchanger 109 and condenser 111. When the cooling fluid comprises a pumped refrigerant, however, pump 123 can be located between heat exchanger 109 and cold plate 110/second interface 127.

It is yet further appreciated that first interface 125 can comprise a portion of cold plate 110 where second electronic component 103 is mounted. Indeed, cold plate 110 can comprise both first interface 115 and second interface 127 to make system 100 more compact; however, in other implementations first electronic component 101 and second electronic component 103 can be mounted on separate cold plates that respectively comprise first interface 115 and second interface 127.

In depicted implementations, each of vapour compression loop 105 and pumped cooling loop 107 share condenser 111. However, in other implementations, each of vapour compression loop 105 and pumped cooling loop 107 can each comprise a respective condenser (i.e. system 100 can comprise two condensers in such implementations).

In any event, in pumped cooling loop 107, heat is transferred from second electronic component 103 to second interface 127 thereby cooling second electronic component 103. However, pumped cooling loop 107 is not a traditional refrigeration loop in the sense that is does not contain the mechanical parts used for sub-ambient cooling (i.e., a compressor, such as compressor 119). Rather, a portion of heat from pumped cooling loop 107 is transferred to vapour compression loop 105 at heat exchanger 109; specifically, heat is transferred from first interface 125 of pumped cooling loop 107 to a second interface 117 of the vapour compression loop 105 at heat exchanger 109, thereby decreasing the temperature of the cooling fluid of pumped cooling loop 107 to cool second electronic component 103 at second interface 127.

Indeed, it is further appreciated that heat exchanger 109 is provided between condenser 119 and cold plate 110 so that the temperature of the cooling fluid in pumped cooling loop 107 can be further reduced from the temperature of the cooling fluid at the outlet of condenser 111. This is accomplished by the cooling fluid of pumped cooling loop 107 transferring heat to the lower temperature vapour compression loop 105 at heat exchanger 109. Ultimately, heat from first electronic component 101 and second electronic component 103 is transferred to the ambient environment at condenser 111; for example, see FIG. 2, described below.

Further, from FIG. 1, it is appreciated that heat exchanger 109 is located after first electronic component 101 on vapour compression loop 105; however, heat exchanger 109 is also located before second electronic component 103 on pumped cooling loop 107. In other words, as is apparent from arrows 122, 132, the refrigerant of vapour compression loop 105 and the cooling fluid from pumped cooling loop 107 are flowing in opposite directions in heat exchanger 109 so that heat is transferred from the cooling fluid to the refrigerant prior to the cooling fluid cooling of second electronic component 103, and after the refrigerant cooling (and subsequent phase change) of the first electronic component 101, but before the refrigerant of vapour compression loop 105 is compressed at compressor 119 and heat is transferred to the ambient environment via condenser 111.

Hence, it is further appreciated that compressor 119 is located after heat exchanger 109 on vapour compression loop 105 as compressor 119 increases pressure (and subsequently temperature) of refrigerant in vapour compression loop 105, which occurs to transfer heat at condenser 111 to the ambient environment.

It is yet further appreciated that heat exchanger 109 is hence further configured as a superheater to raise vapour quality of the refrigerant in vapour compression loop 105 before the refrigerant enters compressor 119 to ensure liquid refrigerant is not being compressed, thereby raising the efficiency of vapour compression 105. In other words, the heat transferred to the refrigerant in heat exchanger 109 by the cooling fluid in the pumped cooling loop 107 causes saturated refrigerant vapour to be superheated.

However, in some implementations, heat transfer can also occur between first interface 115 and second interface 127, for example when cold plate 110 comprises each of first interface 115 and second interface 127; however as first interface 115 and second interface 127 are not configured for heat transfer there between, the heat transfer is not as efficient as the heat transfer that occurs at heat exchanger 109.

Figure 2:
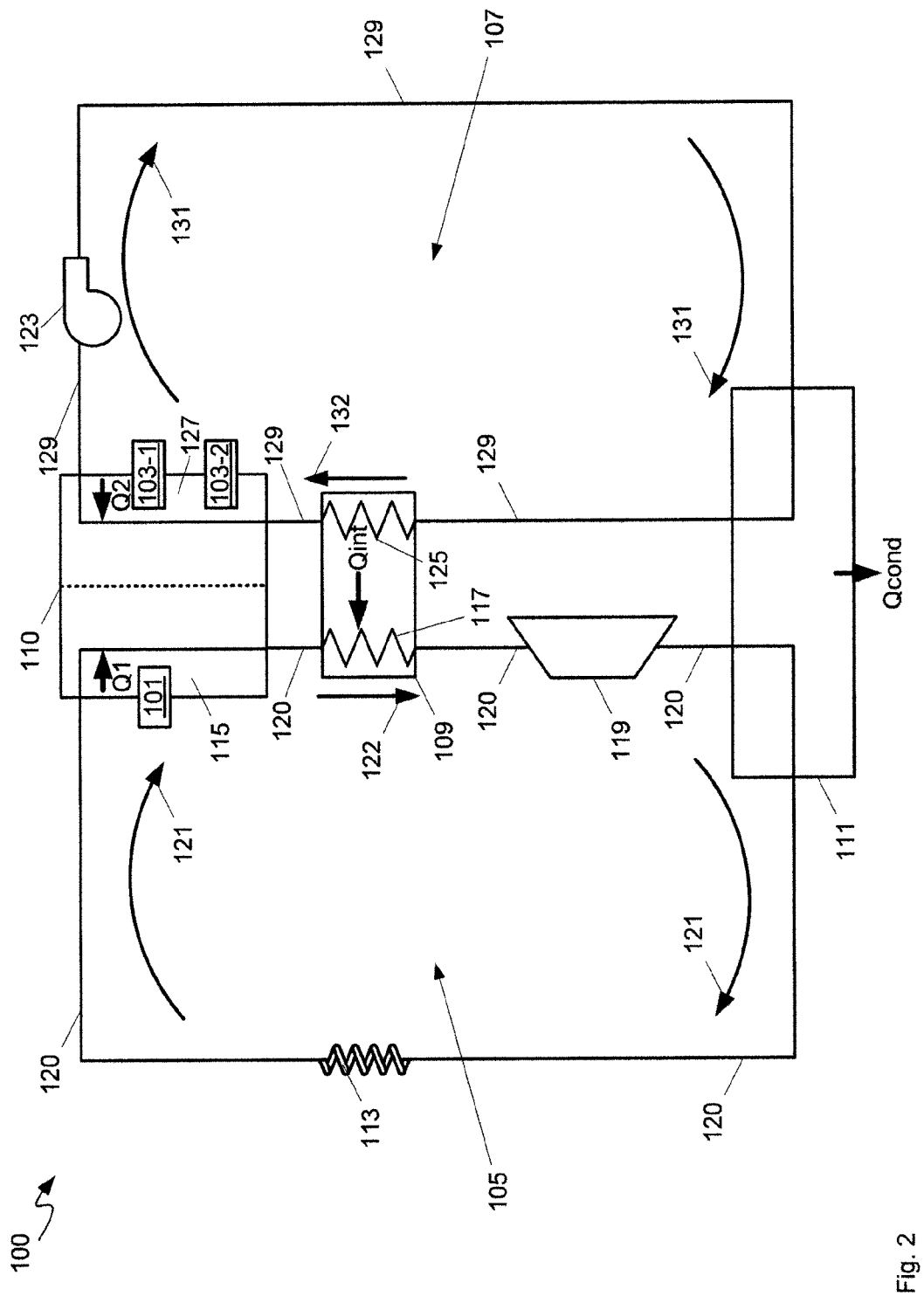
FIG. 2 depicts heat flow in the system of FIG. 1, according to non-limiting implementations.

The heat transfer process is described in greater detail in FIG. 2, which is substantially similar to FIG. 1, with like elements having like numbers. Q1 indicates heat transferred from first electronic component 101 to refrigerant in vapour compression loop 105 at first interface 115, while Q2 indicates heat transferred from second electronic component 103 to cooling fluid in pumped cooling loop 107 at second interface 127. Qint indicates heat transferred at heat exchanger 109 from first interface 125 of pumped cooling loop 107 to second interface 117 of vapour compression loop 105. Qcond indicates total heat transferred to the ambient environment by condenser 111 (e.g. Q1+Q2). In general, compressor 119 is sized for Q1+Qint.

Further, Qint is generally less than or about equal to Q2, for example, when an operating temperature of second electronic component 103 is less than or equal to ambient temperature and/or a near ambient temperature, Qint is equal to Q2. When two condensers are used (e.g. one for each of vapour compression loop 105 and pumped cooling loop 107), Qcond1=Q1+Qint and Qcond2=Q2−Qint (where Qcond1 is the heat transferred to the ambient environment by a first condenser on vapour compression loop 105, and where Qcond2 is the heat transferred to the ambient environment by a second condenser on pumped cooling loop 107); as such Qtotal=Qcond1+Qcond2=Q1+Q2.

Indeed, the respective operating temperatures and cooling requirements of each of first electronic component 101 and second electronic component 103 can be used to determine the cooling capacity of vapour compression loop 105 such that suitable sizes can be chosen for compressor 119, condenser 111, and, expansion apparatus 113 as well as the heat transfer capacity of heat exchanger 109. Further, pump 123 can be controlled based on the respective operating temperatures and cooling requirements of each of first electronic component 101 and second electronic component 103; indeed, it is further appreciated that, in some implementations, pump 123 can comprise a variable speed pump so that the pumping speed can be varied.

In particular non-limiting implementations, each of first electronic component 101 and second electronic component 103 comprises at least one respective laser. For example, in depicted implementations, first electronic component 101 can comprise a red laser and second electronic components 103-1, 103-2 can comprise a green laser and a blue laser. An operating temperature of the red laser can be about 25° C., while an operating temperature of each of the green laser and the blue laser can be about 40° C.

Hence, in these implementations, the first operating temperature is about 25° C. and the second operating temperature is about 40° C. Further system 100 can be specified to operate at an ambient temperature of 40° C., such that the first operating temperature comprises a sub-ambient temperature and the second operating temperature comprises an ambient temperature and/or a near ambient temperature. Hence, an equivalent thermal resistance from first electronic component 101 (e.g. the red laser) to ambient is <0° C./W, and an equivalent thermal resistance from second electronic component 103 (e.g. the green laser and/or the blue laser) to ambient is about equal to 0° C./W.

In any event, if the red, green and blue lasers were cooled with a single refrigerant loop, then the operating temperature of all the lasers would be determined by the lowest operating temperature of one of the lasers, for example the red laser. Since efficiency of some laser types (e.g. some green lasers) can decrease when their temperature decreases below a given operating temperature, such lasers (e.g. the green laser would then operate inefficiently. However by cooling the red laser (e.g. first electronic component 101) using vapour compression loop 105 and cooling the green and blue lasers (e.g. second electronic components 103) with a combination of pumped cooling loop 107 and heat exchanger 109, each of the lasers can be cooled to its most effective operating temperature. Further, by combining the lasers onto one cold plate, the system can be made compact.

In addition to efficiency, present implementations provide for mitigation of condensation risk in system 100. For example, if only a single vapour compression loop was used incoming refrigerant temperature would be dictated by the lowest operating temperature of electronic components 101, 103 (e.g. a red laser with an operating temperature of 25° C.). In some instances, the lowest operating temperature can be less than a dewpoint of an ambient temperature (e.g. 25° C. can be less than the dewpoint in a 40° C. ambient), and hence condensation is a risk since water can cause electrical shorts in electrical components, electronics, lasers and the like. Further, if only one loop was used, the entirety of cold plate 110 could be below dewpoint. However, by using heat exchanger 109 to control electronic components 101, 103 to their individual operating temperatures, at least some of electronic components 101, 103 (e.g. green and blue lasers) are controlled to a temperature above an ambient dewpoint; hence condensation risk on cold plate 110 is significantly mitigated.

Figure 3:
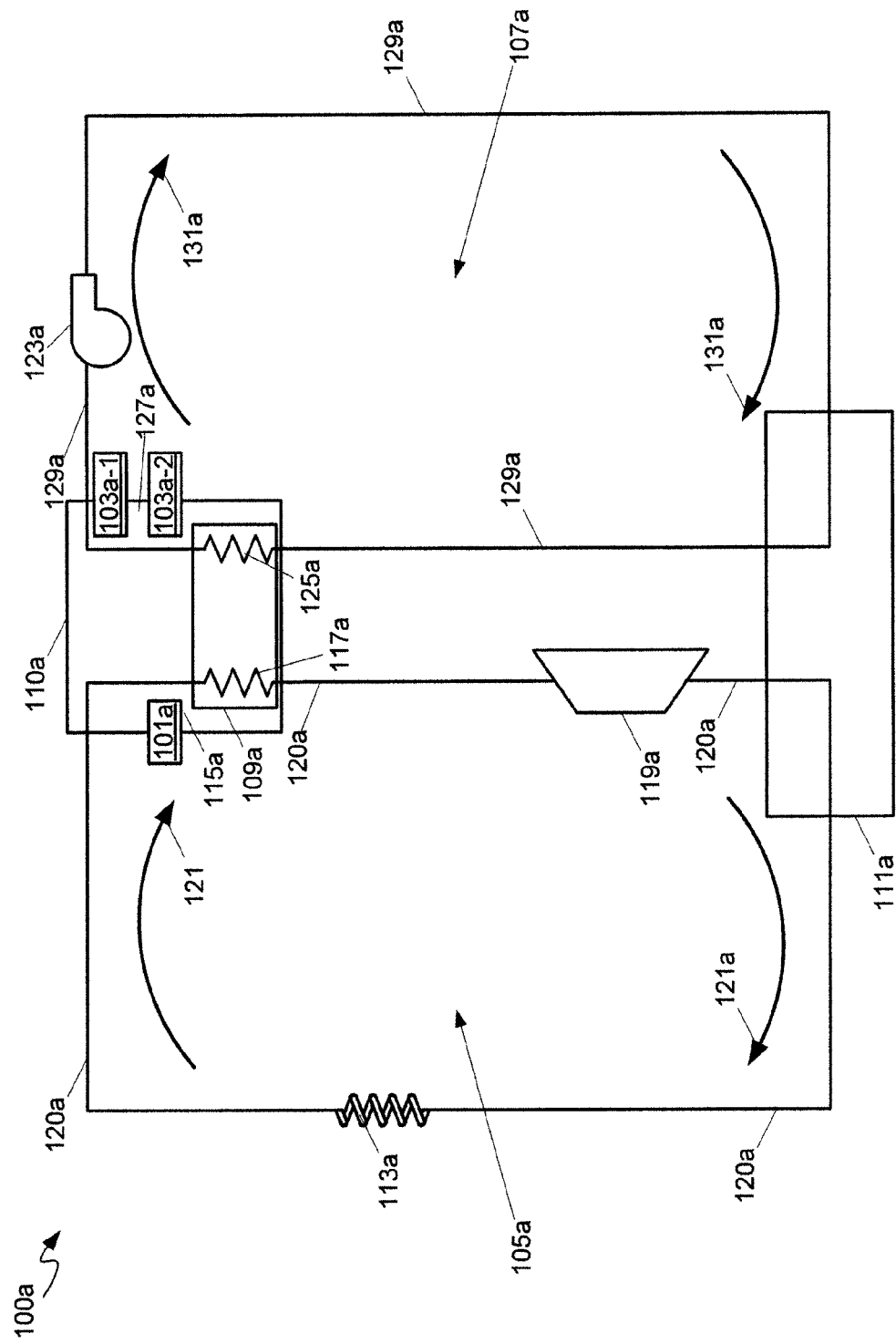
FIG. 3 depicts a schematic diagram of an alternative system or cooling electronic components, according to non-limiting implementations.

Persons skilled in the art will appreciate that there are yet more alternative implementations and modifications possible. For example, attention is next directed to FIG. 3 which depicts an alternative system 100a that is substantially similar to system 100, with like elements having like numbers, but with an "a" appended thereto. Hence, system 100a comprises: a first electronic component 101a having a first operating temperature; at least a second electronic component 103a-1, 103a-2 having a second operating temperature greater than the first operating temperature; a vapour compression loop 105a configured to cool first electronic component 101a to the first operating temperature; a pumped cooling loop 107a configured to cool the second electronic component 103a-1, 103a-2 to the second operating temperature; and a heat exchanger 109a between vapour compression loop 105a and pumped cooling loop 107a, heat exchanger 109a configured to transfer heat from pumped cooling loop 107a to vapour compression loop 105a before second electronic component 103a-1, 103a-1 is cooled and after first electronic component 101a is cooled. Second electronic components 103a-1, 103a-2 will be interchangeably referred to hereafter, collectively, as second electronic components 103a, and generically as a second electronic component 103. System 100a further comprises a condenser 111a, an expansion apparatus 113a, a first interface 115a, a second interface 117a and a compressor 119a on vapour compression loop 105a, with a refrigerant circulating there between via tubing 120a. A direction of circulation of the refrigerant in vapour compression loop 105a is shown by arrows 121a. System 100a further comprises a pump 123a, a first interface 125a and a second interface 127a on pumped cooling loop 107a, with a cooling fluid circulating there between via tubing 129a. A direction of circulation of the cooling fluid in pumped cooling loop 107a is indicated by arrows 131a.

In any event, first electronic component 101a and second electronic component 103a are mounted on a cold plate 110a and, in contrast to system 100, cold plate 110a comprises heat exchanger 109a. In other words, system 100a is more compact than system 100 as heat exchanger 109a is integrated into cold plate 110a. Otherwise system 100a functions in a similar manner to system 100.

Figure 4:
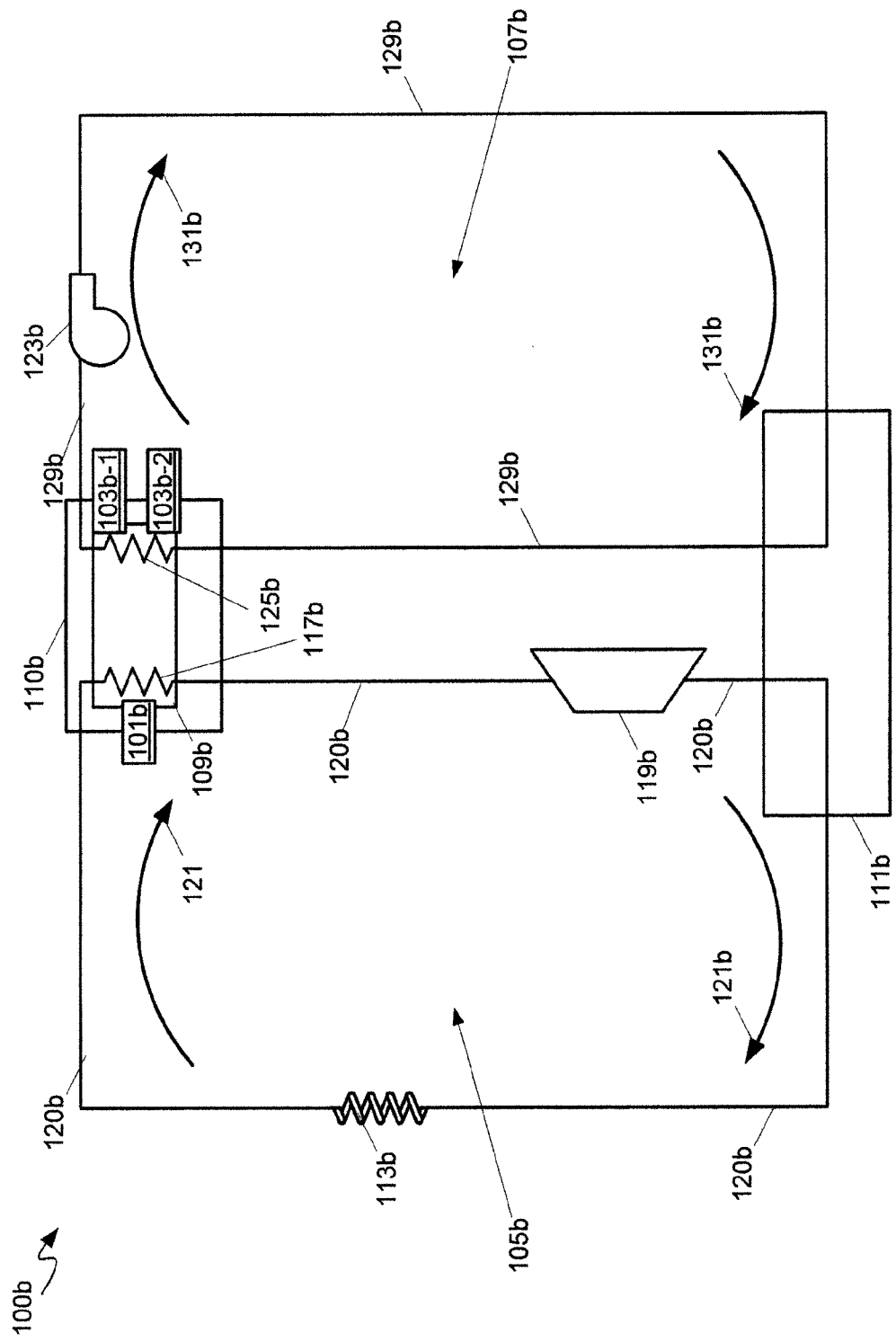
FIG. 4 depicts a schematic diagram of an alternative system for cooling electronic components, according to non-limiting implementations.

Attention is next directed to FIG. 4 which depicts an alternative system 100a that is substantially similar to system 100, with like elements having like numbers, but with a "b" appended thereto. Hence, system 100b comprises: a first electronic component 101b having a first operating temperature; at least a second electronic component 103b-1, 103b-2 having a second operating temperature greater than the first operating temperature; a vapour compression loop 105b configured to cool first electronic component 101b to the first operating temperature; a pumped cooling loop 107b configured to cool the second electronic component 103b-1, 103b-2 to the second operating temperature; and a heat exchanger 109a between vapour compression loop 105b and pumped cooling loop 107b, heat exchanger 109a configured to transfer heat from pumped cooling loop 107b to vapour compression loop 105b before second electronic component 103b-1, 103b-1 is cooled and after first electronic component 101b is cooled. Second electronic components 103b-1, 103b-2 will be interchangeably referred to hereafter, collectively, as second electronic components 103b, and generically as a second electronic component 103. System 100a further comprises a condenser 111b, an expansion apparatus 113b, an interface 117b with both first electronic component 101b and heat exchanger 109b and a compressor 119b on vapour compression loop 105b, with a refrigerant circulating there between via tubing 120b. A direction of circulation of the refrigerant in vapour compression loop 105b is shown by arrows 121b. System 100b further comprises a pump 123b, an interface 125b with both electronic components 103b-1, 103b-2 and heat exchanger 109b on pumped cooling loop 107b, with a cooling fluid circulating there between via tubing 129b. A direction of circulation of the cooling fluid in pumped cooling loop 107b is indicated by arrows 131b.

In any event, first electronic component 101b and second electronic component 103b are mounted on a cold plate 110b and, in contrast to system 100, cold plate 110b comprises heat exchanger 109b. Further, in contrast to system 100a, electronic components 101b, 103b-1, 103b-2 are mounted on an area of cold plate 110b where heat exchanger 109b is located. Specifically, in depicted implementations, electronic component 101b is mounted adjacent interface 117b and electronic components 103b-1, 103b-2 are mounted adjacent interface 125b.

Hence, heat flows from electronic component 101b into the refrigerant of vapour compression loop 105b at interface 117b, which is otherwise similar to second interface 117. In other words, first interface 115a and second interface 117a of system 100a are effectively combined in system 100b in interface 117b.

Similarly, heat flows from electronic components 103-1, 103-2 into the cooling fluid of pumped cooling loop 107b at interface 125b, which is otherwise similar to first interface 125. In other words, first interface 125a and second interface 127a of system 100a are effectively combined in system 100b in interface 125b. Heat is then transferred from the cooling fluid of pumped cooling loop 107b to the refrigerant of vapour compression loop 105b between interfaces 125b, 117b of heat exchanger 109b. Hence, heat exchanger 109b can also be used to cool first electronic component 101b and second electronic components 103b-1, 103b-2.

In other words, system 100b is more compact than system 100 as heat exchanger 109b is integrated into cold plate 110a. System 100b is even more compact than system 100b as electronic components 101b, 103b-1, 103b-2 are mounted on an area of cold plate 110b where heat exchanger 109b is located. Otherwise system 100b functions in a similar manner to systems 100, 100a.

Persons skilled in the art will appreciate that there are yet more alternative implementations and modifications possible, and that the above examples are only illustrations of one or more implementations. The scope, therefore, is only to be limited by the claims appended hereto.

What is claimed is:

1. A system comprising:
a first electronic component having a first operating temperature;
a second electronic component having a second operating temperature greater than the first operating temperature;
a vapour compression loop configured to cool the first electronic component to the first operating temperature;
a pumped cooling loop configured to cool the second electronic component to the second operating temperature; and
a heat exchanger between the vapour compression loop and the pumped cooling loop, the heat exchanger configured to transfer heat from the pumped cooling loop to the vapour compression loop before the second electronic component is cooled and after the first electronic component is cooled.

2. The system of claim 1, wherein the heat exchanger is located after the first electronic component on the vapour compression loop and before the second electronic component on the pumped cooling loop.

3. The system of claim 1, can further comprise a cold plate, wherein each of the first electronic component and the second electronic component are mounted to the cold plate.

4. The system of claim 3, wherein each of the vapour compression loop and the pumped cooling loop comprise a respective portion of the cold plate adjacent to where the first electronic component and the second electronic component are respectively mounted.

5. The system of claim 3, wherein the cold plate comprises the heat exchanger.

6. The system of claim 1, wherein the heat exchanger is further configured as a superheater to raise vapour quality of refrigerant in the vapour compression loop before the refrigerant enters a compressor.

7. The system of claim 1, wherein the vapour compression loop comprises a compressor located after the heat exchanger.

8. The system of claim 1, wherein the vapour compression loop and the pumped cooling loop share a condenser.

9. The system of claim 1, wherein the vapour compression loop comprises a refrigerant and, in order, a condenser, an expansion apparatus, a first interface with the first electronic component, a second interface with the heat exchanger, a compressor, the refrigerant returning to the condenser from the compressor.

10. The system of claim 9, wherein the first interface and the second interface are combined.

11. The system of claim 1, wherein the pumped cooling loop comprises a cooling fluid, a pump, a condenser, a first interface with the heat exchanger, a second interface with the second electronic component and a pump, the first interface with the heat exchanger located between the condenser and the second interface with the second electronic component.

12. The system of claim 11, wherein the first interface and the second interface are combined.

13. The system of claim 1, wherein each of the first electronic component and the second electronic component comprises a respective laser.

14. The system of claim 1, wherein the first electronic component comprises a red laser and the second electronic component comprises one or more of a green laser and a blue laser.

15. The system of claim 1, wherein the first operating temperature comprises a sub-ambient temperature and the second operating temperature comprises a near ambient temperature.

16. The system of claim 1, wherein the first operating temperature is about 25° Celsius and the second operating temperature is about 40° Celsius.

17. The system of claim 1, wherein the pumped cooling loop comprises one of a pumped fluid cooling loop, a pumped liquid cooling loop and a pumped refrigerant loop.

* * * * *